United States Patent
Peterson et al.

(10) Patent No.: US 8,542,488 B2
(45) Date of Patent: Sep. 24, 2013

(54) COOLING APPARATUS FOR AN IC

(75) Inventors: Eric C. Peterson, McKinney, TX (US); Brandon Rubenstein, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 237 days.

(21) Appl. No.: 13/146,884

(22) PCT Filed: Jan. 29, 2009

(86) PCT No.: PCT/US2009/032350
§ 371 (c)(1),
(2), (4) Date: Jul. 28, 2011

(87) PCT Pub. No.: WO2010/087825
PCT Pub. Date: Aug. 5, 2010

(65) Prior Publication Data
US 2011/0304979 A1 Dec. 15, 2011

(51) Int. Cl.
*G06F 1/20* (2006.01)
*H05K 13/00* (2006.01)
*H05K 7/20* (2006.01)

(52) U.S. Cl.
USPC .................. 361/699; 361/679.47; 361/679.54; 361/702

(58) Field of Classification Search
USPC ............... 174/252, 548; 361/679.47, 679.54, 361/699, 701, 702, 709–711
See application file for complete search history.

(56) References Cited

U.S. PATENT DOCUMENTS

| 5,603,374 | A | 2/1997 | Wu |
| 6,578,626 | B1 * | 6/2003 | Calaman et al. ............. 165/80.4 |
| 6,836,408 | B2 * | 12/2004 | Gektin et al. ................ 361/704 |
| 7,042,723 | B2 | 5/2006 | Espersen et al. |
| 7,233,494 | B2 | 6/2007 | Campbell et al. |
| 7,435,623 | B2 * | 10/2008 | Chrysler et al. ............. 438/122 |
| 2006/0050483 | A1 | 3/2006 | Wilson et al. |

OTHER PUBLICATIONS

International Search Report and Written Opinion, dated Oct. 29, 2009, 11 pages.

* cited by examiner

*Primary Examiner* — Anatoly Vortman
*Assistant Examiner* — Jacob Crum
(74) *Attorney, Agent, or Firm* — Steven L. Webb

(57) ABSTRACT

A cooling apparatus is disclosed. The cooling apparatus comprising a printed circuit (PC) board with an integrated circuit (IC) socket mounted onto the top side of the PC board. A mounting frame generally in the shape of a plate, with a first opening passing through the center of the plate, is mounted on the top side of the PC board with the IC socket located inside the first opening. A cold plate is attached to the mounting frame, the cold plate has an opening that passes through the cold plate. The opening in the cold plate is sized to allow an IC to be inserted into the IC socket through the opening. A fluid passageway is formed inside the cold plate. A fluid inlet port and a fluid outlet port are mounted on the cold plate and coupled to a first end and a second end of the fluid passageway, respectively. A heat spreader is removably attached to the top side of the cold plate wherein the bottom side of the heat spreader is configured to contact the top side of an IC when the IC is mounted in the IC socket.

9 Claims, 3 Drawing Sheets

COOLING APPARATUS FOR AN IC

BACKGROUND

Computer data centers or computer servers generate large amounts of heat. Most data centers or servers currently use air to cool the computers or the components in the computer systems. Because of the increasing density of the components in the computer systems, the heat density of the computer systems and data centers is increasing.

The increase in heat density requires either higher air flow rates, cooler air, or both to adequately cool the system components. Cooling air to a temperature below the ambient temperature requires a refrigeration system. Refrigeration systems typically use large amounts of power. In fact, the refrigeration systems for a data center may use more than 50% of the total power required by the data center.

Some data centers use liquids as the heat transfer medium instead of, or in addition to, air. Liquids typically have a much higher heat carrying capacity than air. Unfortunately using liquids as the heat transfer medium can make it difficult to modify or replace components in the computer systems because the coolant lines may need to be opened and then re-sealed.

DETAILED DESCRIPTION

Figure 1:
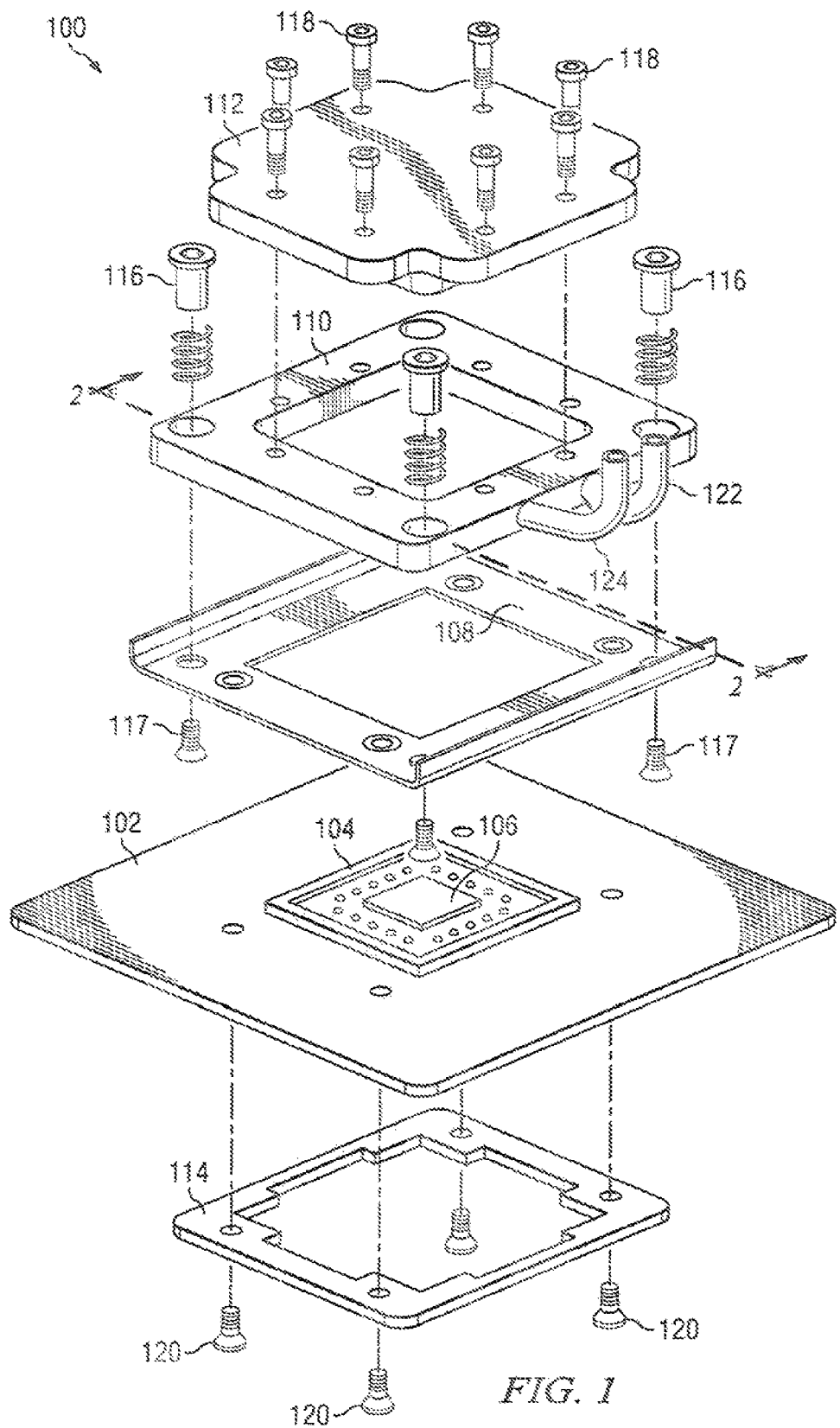
FIG. 1 is an exploded isometric view of a cooling assembly 100 in an example embodiment of the invention.
Figure 2:
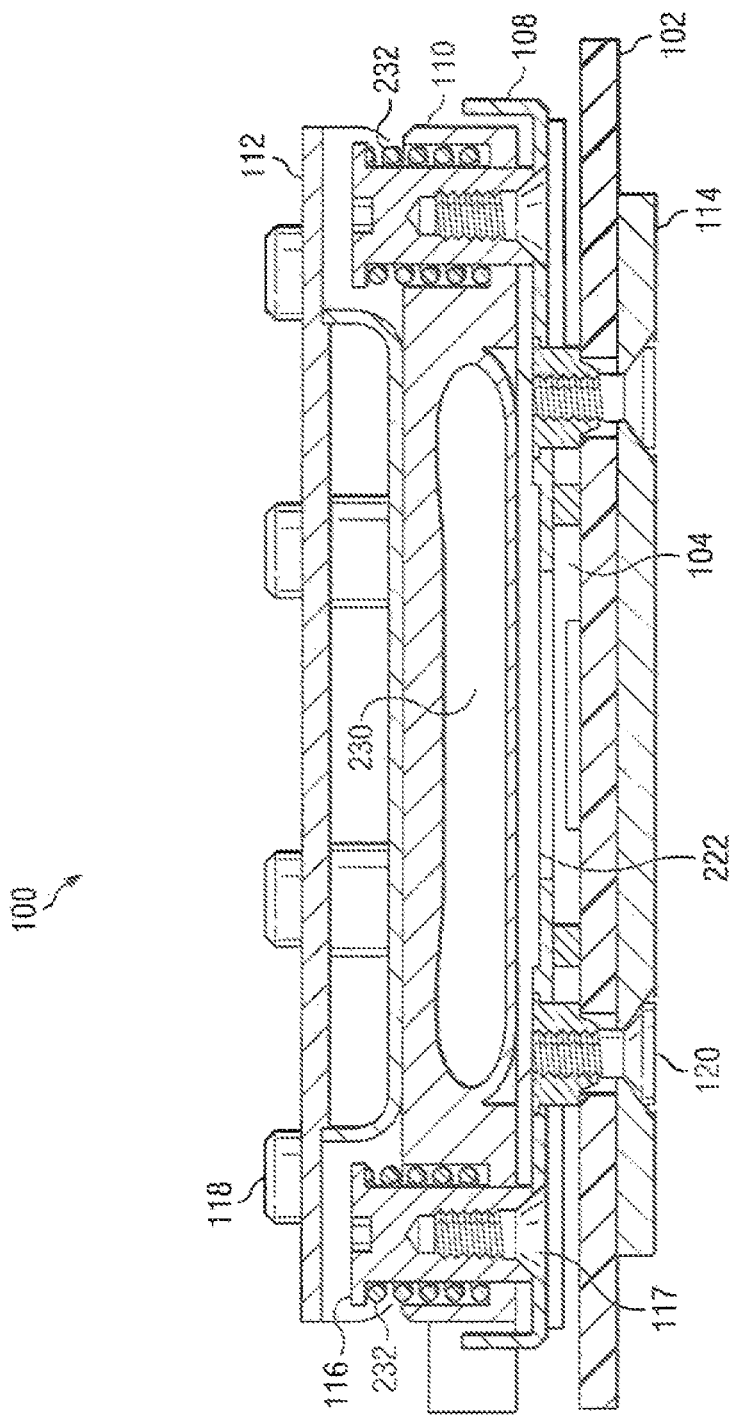
FIG. 2 is a sectional side view along axis AA of cooling assembly 100 in an example embodiment of the invention.
Figure 3:
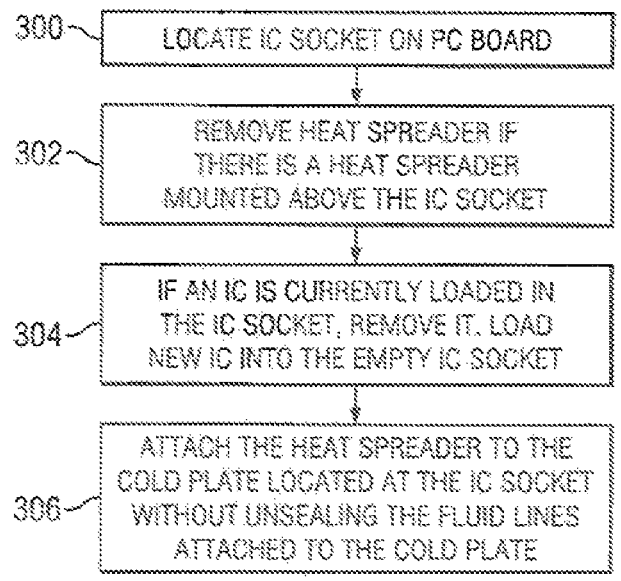
FIG. 3 is a flow chart for loading a cooling apparatus in an example embodiment of the invention.

FIGS. 1-3, and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

FIG. 1 is an exploded isometric view of a cooling assembly 100 in an example embodiment of the invention. Cooling assembly 100 comprises a printed circuit (PC) board 102, an integrated circuit (IC) socket 104, an IC 106, a mounting frame 108, a cold plate 110, a heat spreader 112, and a bolster plate 114. IC socket 104 is installed onto the top side of PC board 102. IC 106 is inserted into IC socket 104. IC 106 may be any type of integrated circuit that requires cooling, for example a microprocessor or an application specific integrated circuit (ASIC). PC board 102 may be a component of a computer or server system, for example a blade, a memory board, an I/O board or the like Mounting frame 108 is attached to the top side of PC board 102 and surrounds IC socket 104. Mounting frame 108 is generally a rectangular plate with an opening in the center configured to allow access to IC socket 104 when mounting frame is installed onto PC board 102. In one example embodiment of the invention, mounting frame is attached directly to PC board 102. Bolster plate 114 may be required on the back side of the PCB, opposite of mounting frame 108, to prevent or control PC board deflections due to the load created during cooling. Bolster plate 114 may incorporate an insulator to prevent shorting to PC board 102. Bolster plate 114 may be attached to the bottom side of PC board 102 with screws 120. In another example embodiment of the invention, bolster plate 114 may be attached to mounting frame 108 with screws 120, thereby sandwiching PC board 102 between bolster plate 114 and mounting frame 108.

Cold plate 110 attaches to mounting frame 108 with shoulder screws 116 and screws 117. Cold plate may be spring loaded towards mounting frame 108 by springs mounted on shoulder screw 116. Shoulder screws 116 are held in place against mounting frame 108 by screws 117. Holes in cold plate 110 mate with shoulder screws 116, allowing cold plate to slide up and down with respect to mounting frame 108. Heat spreader 112 is attached to the top of cold plate 110 using screws 118. Heat spreader 112 is configured to be spring loaded against the top of IC 106.

There are fluid passageways running inside cold plate 110. The fluid passageways generally travel around the hole that passes through the cold plate. A fluid supply line and a fluid return line (not shown) are attached to a fluid inlet 124 and a fluid outlet 122, respectively, on cold plate 110. During operation, a cooling fluid is supplied to cold plate 110 by the fluid supply line and heated fluid is removed from cold plate 110 by the fluid return line. Heat from IC 106 is transferred by heat spreader 118 to cold plate 110. The heat is then removed from cold plate 110 by the cooling fluid flowing through cold plate 110. The fluid channels in Cold plate 110 may be formed by pressing a pipe into a cold plate frame or cutting a channel into a cold plate part and then sealing the channel with a lid. The fluid supply line and fluid return line may be coupled to a heat exchanger, a refrigerator, a chiller, or the like. The fluid supplied to the cold plate may be at or above ambient temperature, or may be chilled to below ambient temperature. The fluid inlet 124 and fluid outlet 122 may be on the same side of the cold plate 110 or on different sides.

A thermal interface material such as grease may be used to increase the thermal coupling between the heat spreader 112 and IC 106. In another example embodiment of the invention, a vapor chamber can be added to the heat spreader to increase the thermal efficiency. The vapor chamber may be located between the heat spreader and the thermal interface material, or may be in direct contact with the top of IC 106. Heat spreader 112 could be constructed of any suitable material for heat transfer. Examples would be a slug made from aluminum, copper, or graphite. In another example embodiment of the invention, heat spreader 110 may have an embedded heat pipe design or vapor chamber design for a high power component requiring better heat transfer between the cold frame and the IC 106.

Cold plate 110 and mounting frame 108 are shaped such that IC 106 can be inserted and/or removed from IC socket 117 while cold plate 110 and mounting frame 108 are attached to PC board 102. Because most IC's are rectangular in shape, both cold plate 110 and mounting frame 108 have a generally rectangular opening formed in their center area. IC 106 may be inserted or removed from IC socket 104 through the rectangular openings. Heat spreader 112 does need to be removed from cold plate 110 to insert and/or remove IC 106 from IC socket 104. Heat spreader 112 is shown attached to cold plate using screws 118, but other attaching devices may be used, for example clips. Because cold plate 110 remains attached to PC board 102 during insertion and removal of IC 106, fluid lines attached to the fluid inlet and fluid outlet ports on cold plate 110 can remain attached thereby keeping the fluid cooling system sealed. Because the fluid supply and return lines don't need to be removed during insertion or removal of an IC 106, the fluid supply and return lines may be flexible or rigid.

FIG. 2 is a sectional side view along axis AA of cooling assembly 100 in an example embodiment of the invention. Cooling assembly 100 comprises PC board 102, an integrated circuit (IC) socket 104, a mounting frame 108, a cold plate 110, a heat spreader 112, and a bolster plate 114. IC socket 104 is installed onto the top side of PC board 102. Fluid passageway 230 is shown formed inside cold plate 110. Springs 232 are shown surrounding shoulder screws 116. Shoulder screws 116 are held against mounting frame 108 by screws 117. Springs 232 apply a force from shoulder screws 116 against cold plate 110, forcing cold plate towards PC board 102. Heat spreader 112 is attached to the top of cold plate 110. Therefore springs 232 force the bottom of heat spreader 112 against the top side of any IC's mounted in IC mount 104.

FIG. 1 only shows one IC socket attached to the top side of PC board 102. In other example embodiments of the invention, there may be a plurality of IC sockets attached to PC board 102. Each of the plurality of IC sockets would have its own mounting frame and cold plate mounted to PC board 102. When PC board is installed into its operating environment, each of the cold plates would be attached to the cooling system by attaching cooling lines to the fluid inlet and fluid outlet ports on the cold plates. Some of the IC sockets may not have IC's loaded when PC board 102 is first installed. At a later time, the empty IC sockets may be filled with ICs. The empty IC sockets can be loaded without un-sealing the fluid cooling lines attached to the cold plates.

The process for loading a cooling apparatus is shown in FIG. 3. At step 300 an IC socket is located on PC board 102. At step 302, if a heat spreader is attached to a cold plate above the IC socket on PC board 102, the heat spreader is removed. At step 304 if an IC is already mounted in the IC socket, it is removed. The new or replacement IC is then inserted into the empty IC socket. At step 306 the heat spreader 112 is placed on top of the IC and then attached to the cold plate using screws. As the screws are tightened, the cold plate is drawn towards the heat spreader. The cold plate is drawn towards the heat spreader against the force of the springs mounted around the shoulder screws. When the screws are fully tightened, the heat spreader and cold plate will be in contact with each other and a pre-loaded spring force will be pressing the bottom of the heat spreader against the top side of the IC loaded in the IC socket. During the process of loading an IC into the empty IC socket, the liquid cooling system remains sealed.

Screws are describe as attaching the heat spreader to the cold plate, but other devices may be used, for example a clamping system or the like. Because the heat spreader is spring loaded against the top of the IC, a larger tolerance stack up in the system can be accommodated. The spring load also provides a calibrated contact force between the heat spreader and the IC, ensuring proper heat transfer between the two parts.

What is claimed is:

1. A cooling apparatus, comprising:
   a printed circuit (PC) board having a top side and a bottom side;
   an integrated circuit (IC) socket mounted onto the top side of the PC board;
   a mounting frame generally in the shape of a plate with a first opening passing through the center of the plate, the mounting frame mounted on the top side of the PC board with the IC socket located inside the first opening;
   a cold plate attached to the mounting frame, the cold plate having a second opening that passes through the cold plate, the second opening aligned with the first opening in the mounting frame and sized to allow an IC to be inserted into the IC socket through the second opening;
   a fluid passageway formed inside the cold plate;
   a fluid inlet port and a fluid outlet port mounted on the cold plate and coupled to a first end and a second end of the fluid passageway, respectively;
   a heat spreader removably attached to a top side of the cold plate wherein a bottom side of the heat spreader is configured to contact a top side of an IC when the IC is mounted in the IC socket.

2. The cooling apparatus of claim 1 further comprising:
   a bolster plate generally in the shape of a plate, the bolster plate mounted on the bottom side of the PC board underneath the mounting frame.

3. The cooling apparatus of claim 2, wherein the bolster plate is attached to the mounting frame thereby holding the PC board between the bolster plate and the mounting frame.

4. The cooling apparatus of claim 1, further comprising:
   at least one spring coupled to the mounting frame and acting to force the cold plate towards the mounting frame.

5. The cooling apparatus of claim 4, further comprising:
   at least one shoulder screw attached to the mounting frame wherein the at least one shoulder screw passes through a third opening in the cold plate and wherein the at least one spring is mounted onto the at least one shoulder screw between a shoulder of the shoulder screw and the cold plate thereby forcing the cold plate towards the mounting frame.

6. The cooling apparatus of claim 1, further comprising:
   a fluid supply line attached to the fluid inlet port;
   a fluid return line attached to the fluid outlet port;
   the fluid supply line and fluid return line attached to a fluid conditioning system that supplies cooling fluid to the fluid supply line and receives heated fluid from the fluid return line.

7. The cooling apparatus of claim 1, further comprising:
   a thermal material located on the bottom side of the heat spreader and configured to contact a top side of an IC when the IC is mounted in the IC socket.

8. The cooling apparatus of claim 1, further comprising:
   an IC mounted in the IC socket.

9. The cooling apparatus of claim 1, wherein the PC board is mounted in a server.

* * * * *